US012131997B2

(12) United States Patent
Jung

(10) Patent No.: US 12,131,997 B2
(45) Date of Patent: Oct. 29, 2024

(54) SEMICONDUCTOR PACKAGES

(71) Applicant: SK hynix Inc., Icheon-si (KR)

(72) Inventor: Won Duck Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 311 days.

(21) Appl. No.: 17/844,337

(22) Filed: Jun. 20, 2022

(65) Prior Publication Data

US 2022/0328412 A1    Oct. 13, 2022

Related U.S. Application Data

(62) Division of application No. 16/863,559, filed on Apr. 30, 2020, now abandoned.

(30) Foreign Application Priority Data

Oct. 17, 2019  (KR) .......................... 10-2019-0129437

(51) Int. Cl.
*H01L 23/528*    (2006.01)
*H01L 23/00*    (2006.01)
(Continued)

(52) U.S. Cl.
CPC ........ *H01L 23/5286* (2013.01); *H01L 23/528* (2013.01); *H01L 23/552* (2013.01); *H01L 24/05* (2013.01); *H01L 24/46* (2013.01); *H01L 25/0657* (2013.01); *H01L 23/49816* (2013.01); *H01L 24/48* (2013.01); *H01L 2224/48* (2013.01); *H01L 2224/48091* (2013.01); *H01L 2224/48106* (2013.01); *H01L 2224/48228* (2013.01); *H01L 2225/0651* (2013.01);
(Continued)

(58) Field of Classification Search
CPC ......... H01L 2224/4813; H01L 23/5381; H01L 2224/48147

See application file for complete search history.

(56) References Cited

U.S. PATENT DOCUMENTS 5,136,358 A    8/1992   Sakai et al.
5,764,489 A    6/1998   Leigh et al.
(Continued)

FOREIGN PATENT DOCUMENTS

CN    110047821 A    7/2019
CN    110112117 A    8/2019
(Continued)

*Primary Examiner* — Phat X Cao
*Assistant Examiner* — Diana C Vieira
(74) *Attorney, Agent, or Firm* — William Park & Associates Ltd.

(57) ABSTRACT

A semiconductor package is configured to include a package substrate, a semiconductor chip disposed on the package substrate, and bonding wires. The package substrate includes a first column of bond fingers disposed in a first layer and a second column of bond fingers disposed in a second layer. The semiconductor chip includes a first column of chip pads arrayed in a first column and a second column of chip pads arrayed in a second column adjacent to the first column. The first column of chip pads are connected to the first column of bond fingers, respectively, through first bonding wires, and the second column of chip pads are connected to the second column of bond fingers, respectively, through second bonding wires.

10 Claims, 14 Drawing Sheets

(51) Int. Cl.
*H01L 23/552* (2006.01)
*H01L 25/065* (2023.01)
*H01L 23/498* (2006.01)

(52) U.S. Cl.
CPC ............... *H01L 2225/06527* (2013.01); *H01L 2225/06537* (2013.01); *H01L 2225/06562* (2013.01); *H01L 2225/06568* (2013.01); *H01L 2924/15184* (2013.01); *H01L 2924/15192* (2013.01); *H01L 2924/15311* (2013.01)

(56) References Cited

U.S. PATENT DOCUMENTS

| | | | |
|---|---|---|---|
| 6,218,631 B1 | 4/2001 | Hetzel et al. | |
| 6,232,560 B1 | 5/2001 | Lin | |
| 6,339,234 B1 * | 1/2002 | Takizawa | H01L 24/06 257/210 |
| 6,501,181 B2 | 12/2002 | Albinsson | |
| 6,870,273 B2 | 3/2005 | Tao et al. | |
| 7,064,412 B2 | 6/2006 | Geissinger et al. | |
| 7,217,998 B2 | 5/2007 | Tamagawa et al. | |
| 7,456,505 B2 * | 11/2008 | Gospodinova | H01L 23/66 257/E23.079 |
| 7,888,806 B2 * | 2/2011 | Lee | H01L 23/528 257/723 |
| 8,018,035 B2 | 9/2011 | Tanaka | |
| 8,138,787 B2 | 3/2012 | Lin et al. | |
| 8,618,649 B2 | 12/2013 | Rathburn | |
| 8,786,061 B2 | 7/2014 | Sawada | |
| 8,803,320 B2 | 8/2014 | Chen | |
| 8,955,216 B2 | 2/2015 | Rathburn | |
| 8,984,748 B2 | 3/2015 | Rathbum | |
| 9,054,097 B2 | 6/2015 | Rathburn | |
| 9,345,136 B1 * | 5/2016 | Kim | H05K 1/112 |
| 9,496,216 B2 * | 11/2016 | Chun | H01L 25/0652 |
| 9,613,841 B2 | 4/2017 | Rathburn | |
| 9,754,872 B1 | 9/2017 | Sato | |
| 10,304,771 B2 | 5/2019 | Sato et al. | |
| 11,083,077 B2 | 8/2021 | Oh et al. | |
| 11,171,112 B2 | 11/2021 | Oikawa | |
| 2003/0015787 A1 | 1/2003 | Geissinger et al. | |
| 2005/0017360 A1 | 1/2005 | Hirano et al. | |
| 2008/0151676 A1 * | 6/2008 | Mizutani | G11C 5/143 365/229 |
| 2009/0321904 A1 | 12/2009 | Tanaka | |
| 2010/0270663 A1 | 10/2010 | Johnston et al. | |
| 2019/0237376 A1 | 8/2019 | Yu et al. | |
| 2019/0237398 A1 | 8/2019 | Yu et al. | |
| 2020/0027813 A1 | 1/2020 | Cheah et al. | |
| 2020/0279830 A1 | 9/2020 | Ayers et al. | |

FOREIGN PATENT DOCUMENTS

| | | |
|---|---|---|
| KR | 1020100059061 A | 6/2010 |
| KR | 101329595 B1 | 11/2013 |

* cited by examiner

SEMICONDUCTOR PACKAGES

CROSS-REFERENCE TO RELATED APPLICATIONS

The present application is a divisional application of U.S. patent application Ser. No. 16/863,559, filed on Apr. 30, 2020, and claims priority under 35 U.S.C 119(a) to Korean Application No. 10-2019-0129437, filed on Oct. 17, 2019, which is incorporated herein by references in its entirety.

BACKGROUND

1. Technical Field

Embodiments of the present disclosure relate to package technologies and, more particularly, to semiconductor packages including chip pads arrayed in a matrix form.

2. Related Art

Semiconductor packages may be configured to include a package substrate on which a semiconductor chip is mounted. The package substrate may act as an interconnection member including traces. The package substrate may be electrically connected to the semiconductor chip, which is mounted on the package substrate, by bonding wires. The bonding wires may electrically connect chip pads of the semiconductor chip to bonding fingers of the traces included in the package substrate.

SUMMARY

According to an embodiment, a semiconductor package includes a package substrate including a first column of bond fingers disposed in a first layer and a second column of bond fingers disposed in a second layer. The semiconductor package also includes a semiconductor chip disposed on the package substrate to include a first column of chip pads arrayed in a first column and a second column of chip pads arrayed in a second column adjacent to the first column. The semiconductor package further includes first bonding wires connecting the first column of chip pads to the first column of bond fingers, respectively, and second bond fingers connecting the second column of chip pads to the second column of bond fingers, respectively. The first column of chip pads includes a first signal pad, a ground pad, and a second signal pad which are sequentially arrayed in the first column. The second column of chip pads includes a first power pad, a third signal pad, and a second power pad which are sequentially arrayed in the second column. The third signal pad and the ground pad are arrayed in the same row to be disposed side by side.

According to another embodiment, a semiconductor package includes a package substrate including a first column of bond fingers arrayed in a first layer and a second column of bond fingers arrayed in a second layer. A first semiconductor chip is disposed on the package substrate to include a first column of chip pads arrayed in a first column, a second column of chip pads arrayed in a second column, a third column of chip pads arrayed in a third column located at one side of the second column opposite to the first column, and common interconnection lines for connecting the third column of chip pads to the first column of chip pads. A second semiconductor chip is disposed on the first semiconductor chip to include a first column of chip pads and a second column of chip pads. First bonding wires connect the first column of bond fingers to the first column of chip pads of the first semiconductor chip. Second bonding wires connect the second column of bond fingers to the second column of chip pads of the first semiconductor chip. Third bonding wires connect the first column of chip pads of the second semiconductor chip to the third column of chip pads of the first semiconductor chip. Fourth bonding wires connect the second column of chip pads of the second semiconductor chip to the second column of chip pads of the first semiconductor chip.

DETAILED DESCRIPTION OF THE EMBODIMENTS

Figure 1:
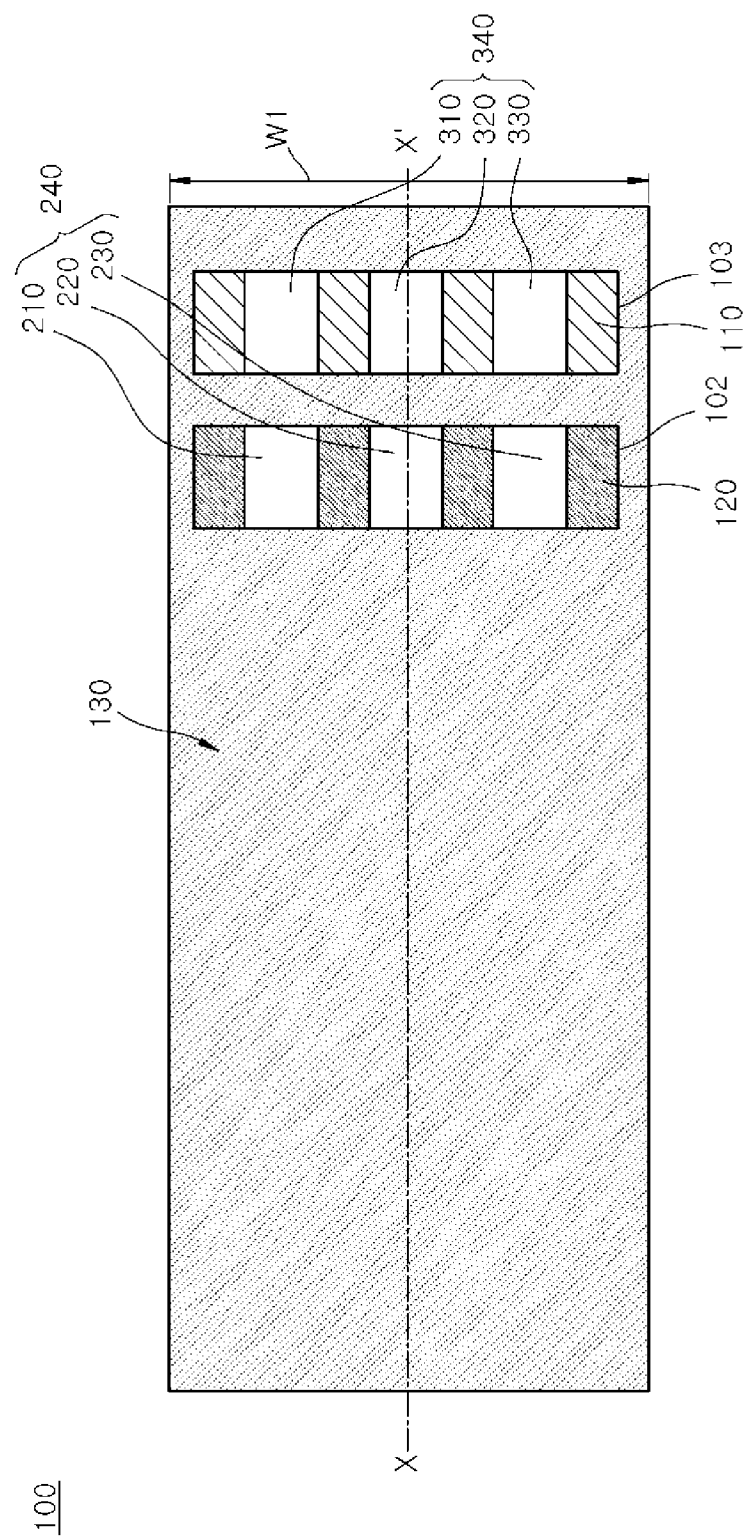
FIGS. 1 and 2 are a plan view and a cross-sectional view, respectively, illustrating a package substrate included in a semiconductor package according to an embodiment.

The terms used herein may correspond to words selected in consideration of their functions in presented embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third" etc. may be used herein to describe various elements, these elements should not be limited by these terms. These terms are used to distinguish one element from another element and are not used to define a particular number or sequence elements unless specifically specified.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or a feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

A semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips, or application specific integrated circuits (ASIC) chips. The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits, or phase change random access memory (PcRAM) circuits which are integrated on the semiconductor substrate. The semiconductor package may be employed in communication systems such as mobile phones, electronic systems associated with biotechnology or health care, or wearable electronic systems. The semiconductor packages may be applicable to internet of things (IoT).

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

As semiconductor chips included in semiconductor packages become more highly integrated, sizes of chip pads and distances between the chip pads have been reduced. In addition, sizes of bond fingers corresponding to the chip pads and distances between the bond fingers also have been reduced with the reduction of the sizes of the chip pads and the distances between the chip pads. However, there may be some restrictions in scaling down the bond fingers due to limitations of processes for forming the bond fingers and traces. Moreover, as the bond fingers become scaled down, it may be accompanied with some problems (e.g., signal delay due to interference between signals) to overcome. These problems may be solved by disposing the chip pads on a semiconductor chip in a matrix form and by disposing the bond fingers on a package substrate in a matrix form to correspond to the chip pads when the semiconductor packages are designed.

Figure 2:
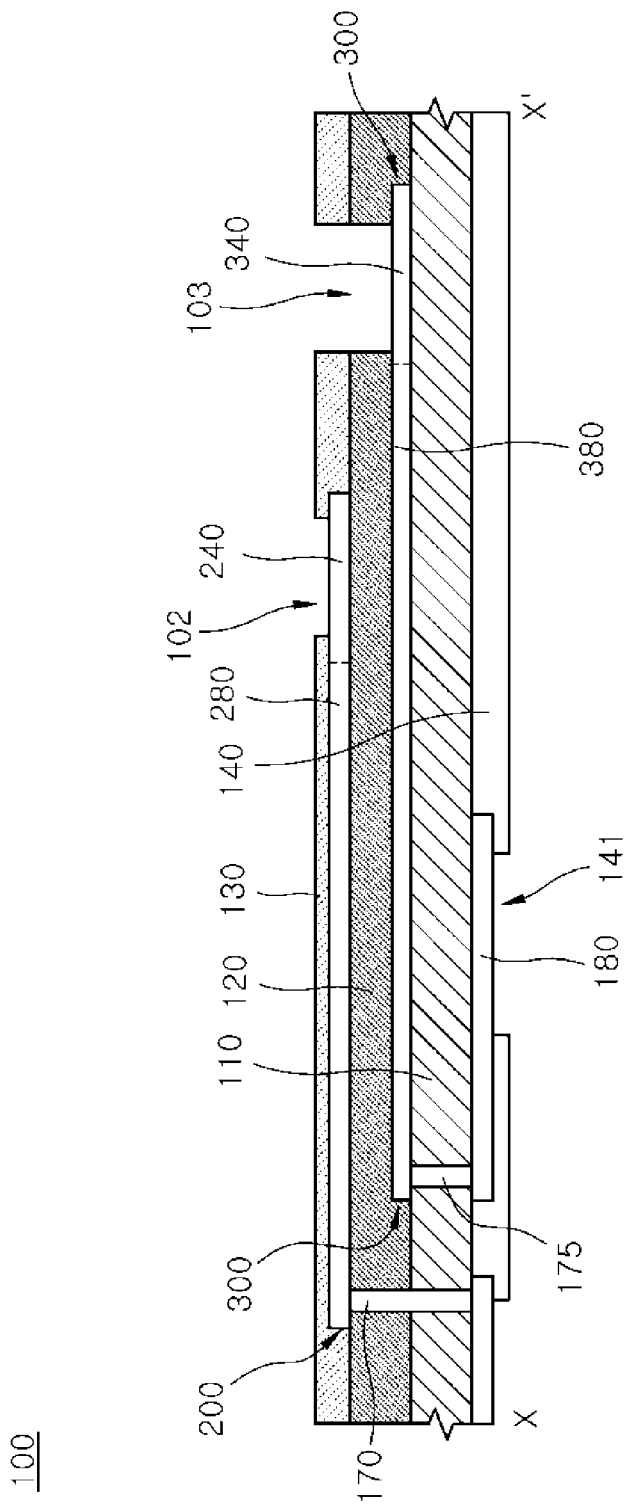

FIGS. 1 and 2 are a plan view and a cross-sectional view, respectively, illustrating a package substrate 100 employed in a semiconductor package according to an embodiment. FIG. 2 is a cross-sectional view taken along a line X-X' of FIG. 1.

Referring to FIGS. 1 and 2, the package substrate 100 may be configured to provide a semiconductor package including a semiconductor chip which is mounted on the package substrate 100. The package substrate 100 may act as an interconnection member including a circuit line structure for electrically connecting the semiconductor chip to another electronic device. The package substrate 100 may be a printed circuit board (PCB).

As illustrated in FIG. 2, the package substrate 100 may be configured to include a first dielectric layer 110 and a second dielectric layer 120 formed on the first dielectric layer 110. Each of the first and second dielectric layers 110 and 120 may include a dielectric material or an insulating material, for example, an epoxy resin material. A third dielectric layer 130 may be additionally stacked on the second dielectric layer 120 opposite to the first dielectric layer 110. The third dielectric layer 130 may be formed to include a solder resist layer. A fourth dielectric layer 140 may also be disposed on a surface of the first dielectric layer 110 opposite to the second dielectric layer 120. The fourth dielectric layer 140 may be formed to include a solder resist layer.

As illustrated in FIG. 2, the package substrate 100 may include a first column of bond fingers 240 and a second column of bond fingers 340. The first and second columns of bond fingers 240 and 340 may correspond to portions of circuit lines to which bonding wires are connected. The first column of bond fingers 240 may be arrayed in a first column, and the second column of bond fingers 340 may be arrayed in a second column. That is, the first and second columns of bond fingers 240 and 340 may be arrayed in two adjacent columns which are parallel with each other.

The first column of bond fingers 240 may include a plurality of bond fingers 210, 220, and 230 which are sequentially arrayed in one direction. The bond finger 210 may be a first signal bond finger, the bond finger 220 may be a ground bond finger, and the bond finger 230 may be a second signal bond finger. Additional ground bond fingers and additional signal bond fingers may be alternately arrayed in the first column to be adjacent to the first signal bond finger 210 or the second signal bond finger 230.

The second column of bond fingers 340 may include a plurality of bond fingers 310, 320, and 330 which are sequentially arrayed in one direction. The bond finger 310 may be a first power bond finger, the bond finger 320 may be a third signal bond finger, and the bond finger 330 may be a second power bond finger. Additional signal bond fingers and additional power bond fingers may be alternately arrayed in the second column to be adjacent to the first power bond finger 310 or the second power bond finger 330.

Because the first column of bond fingers 240 and the second column of bond fingers 340 are arrayed in two parallel columns, it may be possible to maintain at least a certain pitch of the first and second columns of bond fingers 240 and 340 even though a width W1 of the package substrate 100 is limited or restricted. The first and second columns of bond fingers 240 and 340 arrayed in two columns may be disposed to have relatively enough pitch as compared with a case in which the first and second columns of bond fingers 240 and 340 are arrayed in one column. If bond fingers arrayed in two columns are redisposed in one column, distances between the bond fingers and a size of the bond fingers have to be reduced. In such a case, there may be a difficulty in forming the bond fingers in one column due to a limitation of process techniques for forming the bond fingers. However, as illustrated in FIG. 1, if the first and second columns of bond fingers 240 and 340 are arrayed in two columns, it may be possible to form the first and second columns of bond fingers 240 and 340 without being subject to the limitation of process techniques.

The first power bond finger 310 and the second power bond finger 330 may be bond fingers to which a power supply voltage is applied. The first, second, and third signal bond fingers 210, 230, and 320 may be bond fingers to which data signals are applied. The ground bond finger 220 may be a bond finger to which a ground voltage is applied.

The third signal bond finger 320 and the ground bond finger 220 may be arrayed in the same row to be disposed side by side. The third signal bond finger 320 may be disposed to be relatively closer to the ground bond finger 220 than the first and second signal bond fingers 210 and 230. The first power bond finger 310 and the first signal bond finger 210 may be arrayed in the same row to be disposed side by side. The second power bond finger 330 and the second signal bond finger 230 may be arrayed in the same row to be disposed side by side. The first signal bond finger 210, the third signal bond finger 320, and the second signal bond finger 230 may be arrayed in a zigzag fashion along a direction which is parallel with the first and second columns. A row may be substantially perpendicular to the first and second columns in which the first and second columns of bond fingers 240 and 340 are arrayed.

As illustrated in FIG. 2, a first layer of traces 280 may extend from the first column of bond fingers 240, respectively. The first column of bond fingers 240 and the first layer of traces 280 may constitute a portion of a circuit line structure included in the package substrate 100. The first column of bond fingers 240 and the first layer of traces 280 may constitute a first layer 200 of the circuit line structure.

A second layer of traces 380 may extend from the second column of bond fingers 340, respectively. The second column of bond fingers 340 and the second layer of traces 380 may constitute another portion of the circuit line structure included in the package substrate 100. The second column of bond fingers 340 and the second layer of traces 380 may constitute a second layer 300 of the circuit line structure.

The first column of bond fingers 240 and the first layer of traces 280 may be disposed in the first layer 200 of the circuit line structure, and the second column of bond fingers 340 and the second layer of traces 380 may be disposed in the second layer 300 of the circuit line structure. The first layer 200 including the first column of bond fingers 240 and the first layer of traces 280 may be located on a surface of the second dielectric layer 120 opposite to the first dielectric layer 110. The first layer of traces 280 may be conductive lines extending from the first column of bond fingers 240 onto the second dielectric layer 120. The first layer of traces 280 may be located to vertically overlap with the second layer of traces 380, respectively. The first layer of traces 280 may be disposed to have overlap portions that vertically overlap with the second layer of traces 380.

The second layer 300 including the second column of bond fingers 340 and the second layer of traces 380 may be located between the first dielectric layer 110 and the second dielectric layer 120. The second dielectric layer 120 may be a layer for electrically insulating the second layer of traces 380 from the first layer of traces 280. The third dielectric layer 130 may cover the first layer of traces 280 to electrically insulate the first layer of traces 280 from each other. The third dielectric layer 130 may be formed to have a first opening portion 102 that reveals the first column of bond fingers 240. A second opening portion 103 may be formed to penetrate a portion of the third dielectric layer 130 and a portion of the second dielectric layer 120. The second opening portion 103 provided by the third dielectric layer 130 and the second dielectric layer 120 may reveal the second column of bond fingers 340.

As illustrated in FIG. 2, the package substrate 100 may further include a third layer of traces 180 constituting still another portion of the circuit line structure. The third layer of traces 180 may be disposed on a surface of the first dielectric layer 110 opposite to the second dielectric layer 120. At least one of the third layer of traces 180 may be electrically connected to one of the first layer of traces 280 through a first conductive via 170. The first conductive via 170 may be a conductive member that vertically penetrates the first and second dielectric layers 110 and 120. Another one of the third layer of traces 180 may be electrically connected to one of the second layer of traces 380 through a second conductive via 175. The second conductive via 175 may be a conductive member that vertically penetrates the first dielectric layer 110. The fourth dielectric layer 140 may have a third opening portion 141 that reveals a portion of one of the third layer of traces 180. An outer connector such as a solder ball may be connected to the reveled portion of the trace 180.

Figure 3:
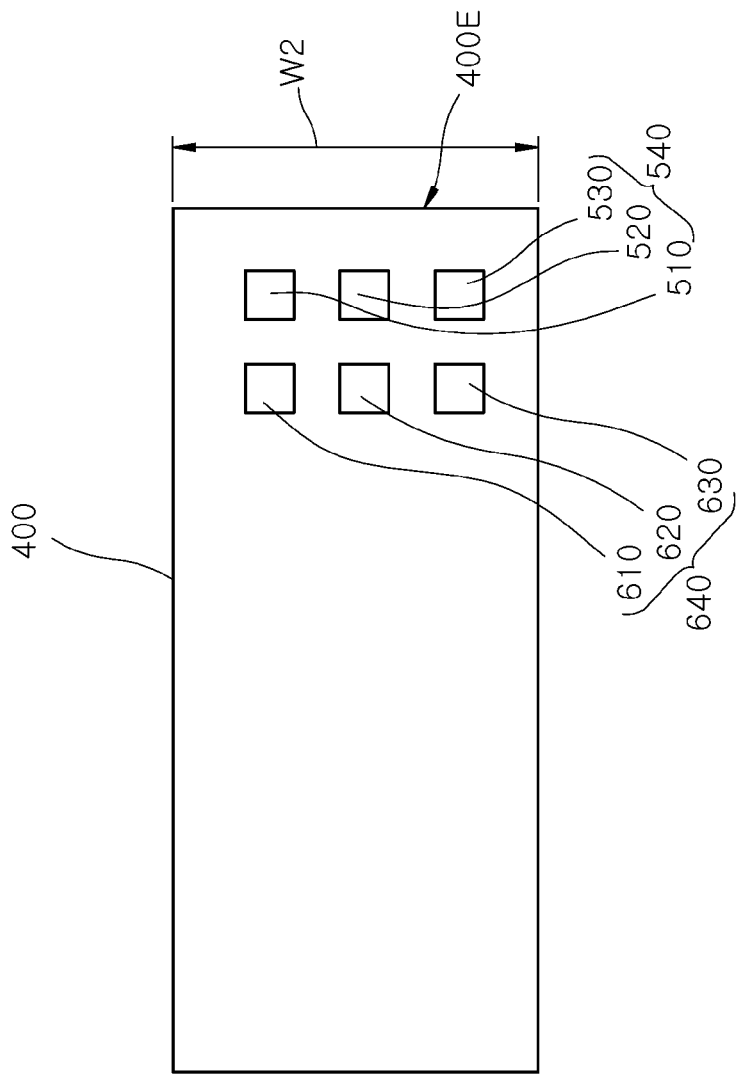
FIG. 3 is a plan view illustrating a chip pad array of a semiconductor chip included in a semiconductor package according to an embodiment.

FIG. 3 is a plan view illustrating a chip pad array of a semiconductor chip 400 included in a semiconductor package according to an embodiment.

Referring to FIG. 3, a semiconductor package according to an embodiment may be configured to include the semiconductor chip 400. The semiconductor chip 400 may be a semiconductor device in which an integrated circuit is formed. The semiconductor chip 400 may be a memory semiconductor device. The semiconductor chip 400 may include a chip pad array which is comprised of a first column of chip pads 540 and a second column of chip pads 640. The first column of chip pads 540 may be arrayed in a first column which is parallel with an edge 400E. The second column of chip pads 640 may be arrayed in a second column adjacent to the first column. Because the first column of chip pads 540 and the second column of chip pads 640 are arrayed in two parallel columns, it may be possible to maintain at least a certain pitch of the first and second columns of chip pads 540 and 640 even though a width W2 of the semiconductor chip 400 is limited or restricted. That is, the first and second columns of chip pads 540 and 640 arrayed in two columns may be disposed to have enough pitch as compared with a case that the first and second columns of chip pads 540 and 640 are arrayed in one column.

The first column of chip pads 540 may include a plurality of chip pads 510, 520, and 530 which are sequentially arrayed in one direction. The chip pad 510 may be a first signal pad, the chip pad 520 may be a ground pad, and the chip pad 530 may be a second signal pad. Additional ground pads and additional signal pads may be alternately arrayed in the first column to be adjacent to the first signal pad 510 or the second signal pad 530.

The second column of chip pads 640 may include a plurality of chip pads 610, 620, and 630 which are sequentially arrayed in one direction. The chip pad 610 may be a first power pad, the chip pad 620 may be a third signal pad, and the chip pad 630 may be a second power pad. Additional signal pads and additional power pads may be alternately arrayed in the second column to be adjacent to the first power pad 610 or the second power pad 630.

The third signal pad 620 and the ground pad 520 may be arrayed in the same row to be disposed side by side. The third signal pad 620 may be disposed to be relatively closer to the ground pad 520 than the first and second signal pads 510 and 530. The first power pad 610 and the first signal pad 510 may be arrayed in the same row to be disposed side by side. The second power pad 630 and the second signal pad 530 may be arrayed in the same row to be disposed side by side. The first signal pad 510, the third signal pad 620, and the second signal pad 530 may be arrayed in a zigzag fashion along a direction which is parallel with the first and second columns. A row may be substantially perpendicular to the first and second columns in which the first and second columns of chip pads 540 and 640 are arrayed. A row direction parallel with the row may be substantially perpendicular to the edge 400E.

The first power pad 610 and the second power pad 630 may be chip pads to which a power supply voltage is applied. The first, second, and third signal pads 510, 530, and 620 may be chip pads to which data signals are applied. The ground pad 520 may be a chip pad to which a ground voltage is applied.

Figure 4:
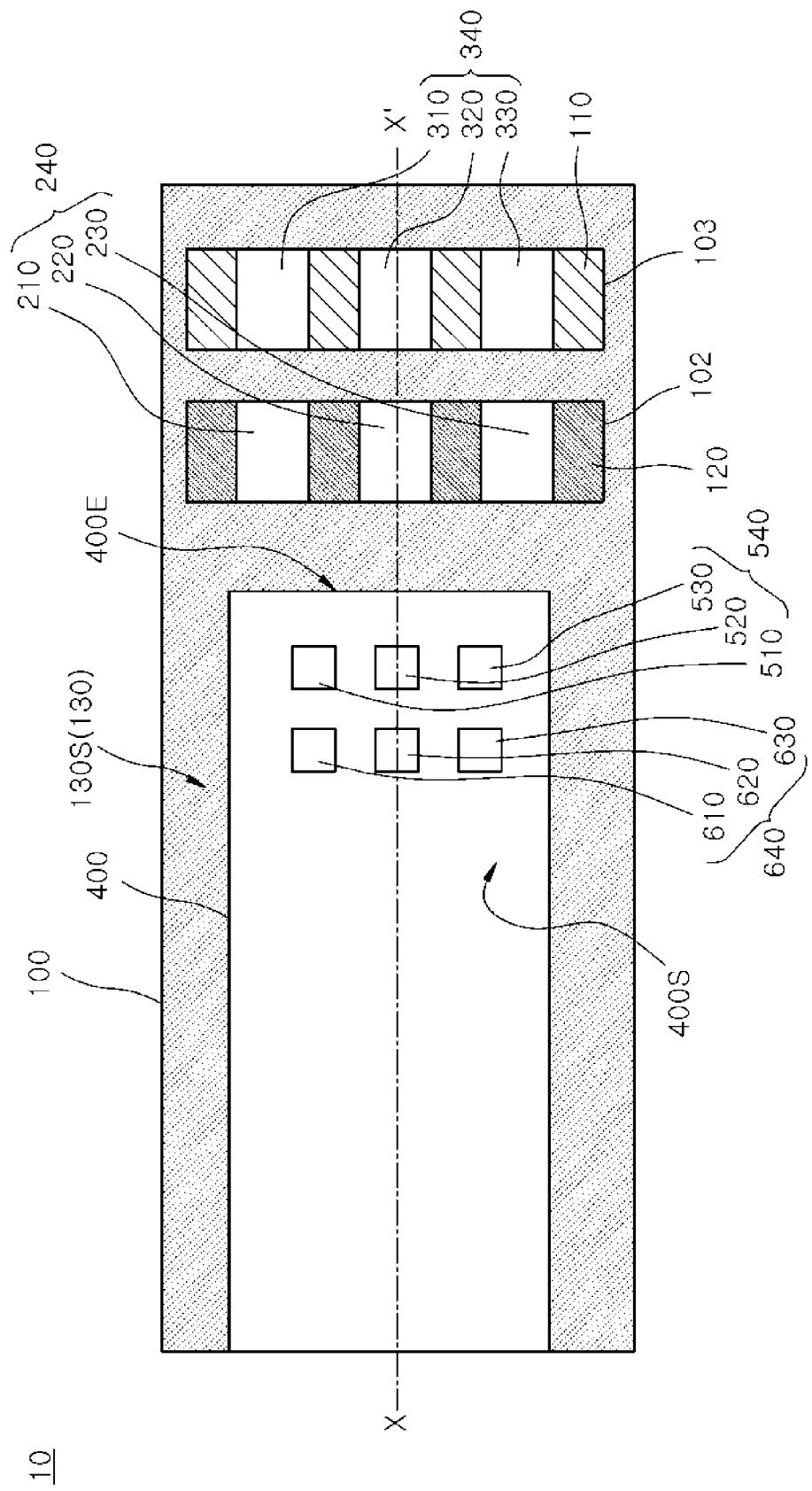
FIGS. 4 to 6 are plan views and a cross-sectional view illustrating a semiconductor package according to an embodiment.
Figure 5:
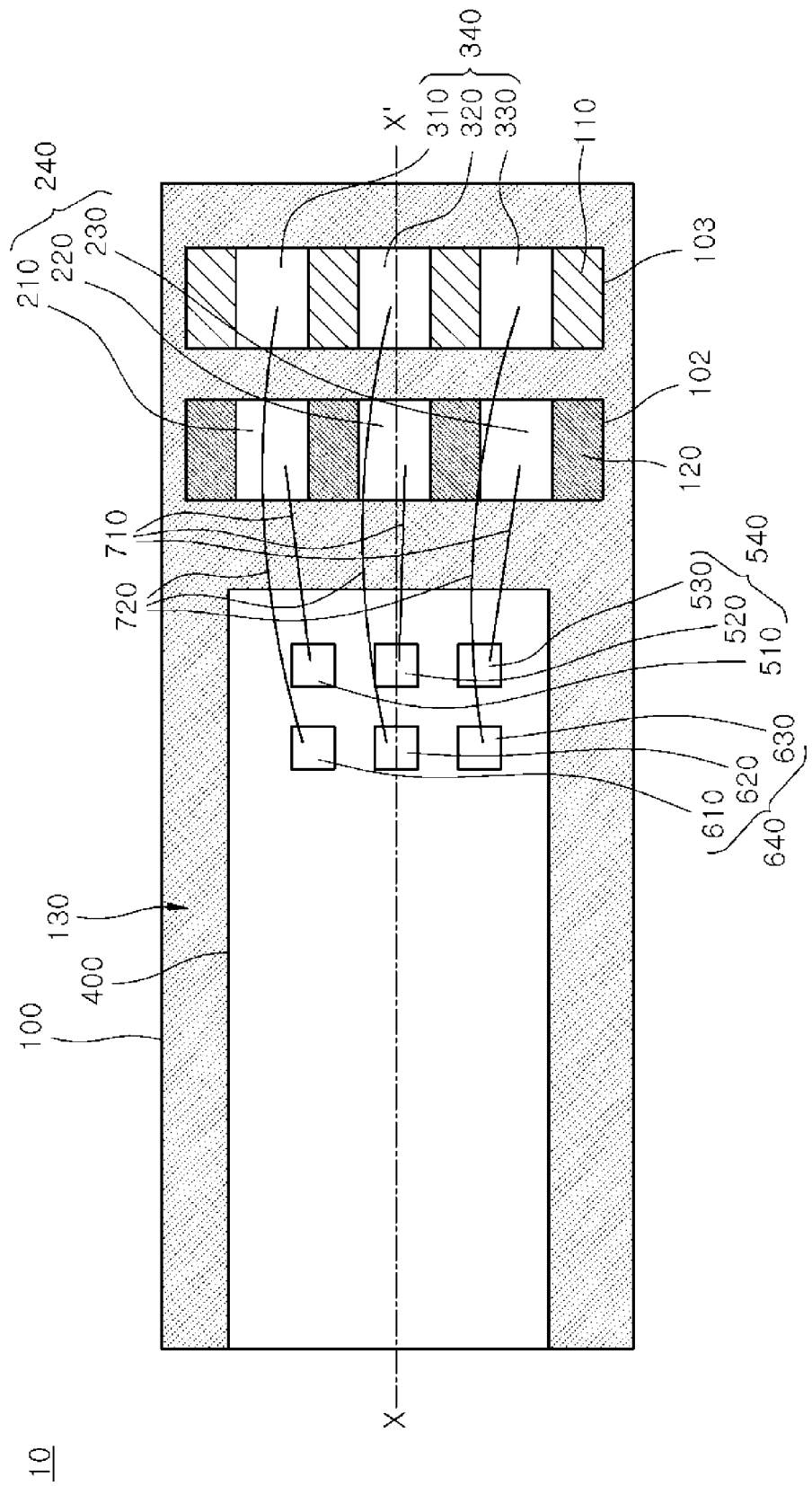
Figure 6:
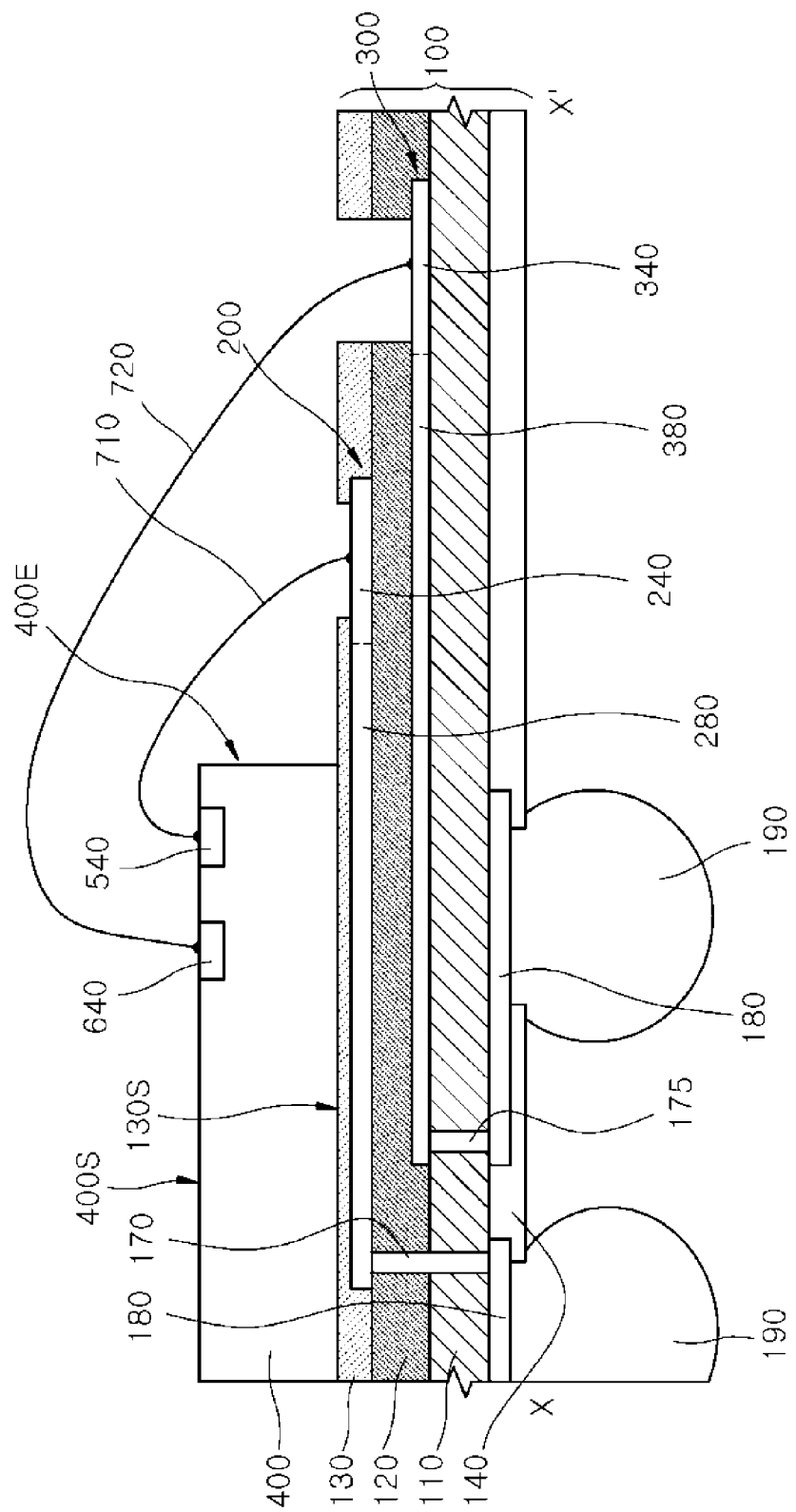

FIGS. 4, 5, and 6 are plan views and a cross-sectional view illustrating a semiconductor package 10 according to an embodiment. FIG. 4 is a plan view illustrating the package substrate 100 and the semiconductor chip 400 disposed on the package substrate 100. FIG. 5 is a plan view illustrating first and second bonding wires 710 and 720 connecting the semiconductor chip 400 to the package substrate 100. FIG. 6 is a cross-sectional view taken along a line X-X' of the semiconductor package 10 shown in FIG. 5.

Referring to FIGS. 4 and 6, the semiconductor chip 400 may be mounted on the package substrate 100 to provide the semiconductor package 10. The semiconductor chip 400 may be mounted on a top surface 130S of the package substrate 100. The semiconductor chip 400 may be disposed on the package substrate 100 such that a top surface 400S of the semiconductor chip 400 faces in the same direction as the top surface 130S of the package substrate 100. The semiconductor chip 400 may be disposed on the package substrate 100 such that the first column of bond fingers 240 and the second column of bond fingers 340 may be revealed to be adjacent to the edge 400E of the semiconductor chip 400.

Referring to FIGS. 5 and 6, the semiconductor package 10 may be configured to include the first and second bonding wires 710 and 720 that connect the chip pads 540 and 640 of the semiconductor chip 400 to the bond fingers 240 and 340 of the package substrate 100. The first bonding wires 710 may connect the first column of chip pads 540 to the first column of bond fingers 240. The first column of chip pads 540 may be sequentially connected to respective ones of the first column of bond fingers 240 through the first bonding wires 710. The second bonding wires 720 may connect the second column of chip pads 640 to the second column of bond fingers 340. The second column of chip pads 640 may be sequentially connected to respective ones of the second column of bond fingers 340 through the second bonding wires 720.

The first column of chip pads 540 and the first column of bond fingers 240 may be disposed to be adjacent to the edge 400E of the semiconductor chip 400. The first column of chip pads 540 may be located to be relatively closer to the edge 400E of the semiconductor chip 400 than the second column of chip pads 640 are close to the edge 400E of the semiconductor chip 400. The first column of bond fingers 240 may be located to be relatively closer to the edge 400E of the semiconductor chip 400 than the second column of bond fingers 340 are close to the edge 400E of the semiconductor chip 400.

As a result, a distance between the first column of chip pads 540 and the first column of bond fingers 240 may be less than a distance between the second column of chip pads 640 and the second column of bond fingers 340. Thus, the first bonding wires 710 may have lengths which are shorter than lengths of the second bonding wires 720. That is, the second bonding wires 720 may be longer than the first bonding wires 710. As the second bonding wires 720 extend to be longer than the first bonding wires 710, the second bonding wires 720 may be formed to have a loop shape which is higher than a loop shape of the first bonding wires 710. As such, because the lengths of the first bonding wires 710 are different from the lengths of the second bonding wires 720 and the heights of the first bonding wires 710 having a loop shape are different from the heights of the second bonding wires 720 having a loop shape, it may be possible to prevent the first bonding wires 710 from being in contact with the second bonding wires 720.

The semiconductor package 10 may further include outer connectors 190 attached to the portions of the third layer of traces 180. In addition, although not shown in the drawings, the semiconductor package 10 may further include an encapsulant covering and protecting the semiconductor chip 400 and the first and second bonding wires 710 and 720.

Referring again to FIG. 6, the first layer of traces 280 and the first column of bond fingers 240 constituting the first layer 200 may be located to be closer to the top surface 130S of the package substrate 100 than the second layer of traces 380 and the second column of bond fingers 340 constituting the second layer 300 are close to the top surface 130S of the package substrate 100. Thus, the first column of bond fingers 240 may be located at a different level from the second column of bond fingers 340. Because the first column of bond fingers 240 are located at a different level from the second column of bond fingers 340, portions of the first layer of traces 280 may be located to vertically overlap with portions of the second layer of traces 380. The top surface 130S of the package substrate 100 may be a surface facing the semiconductor chip 400.

Figure 7:
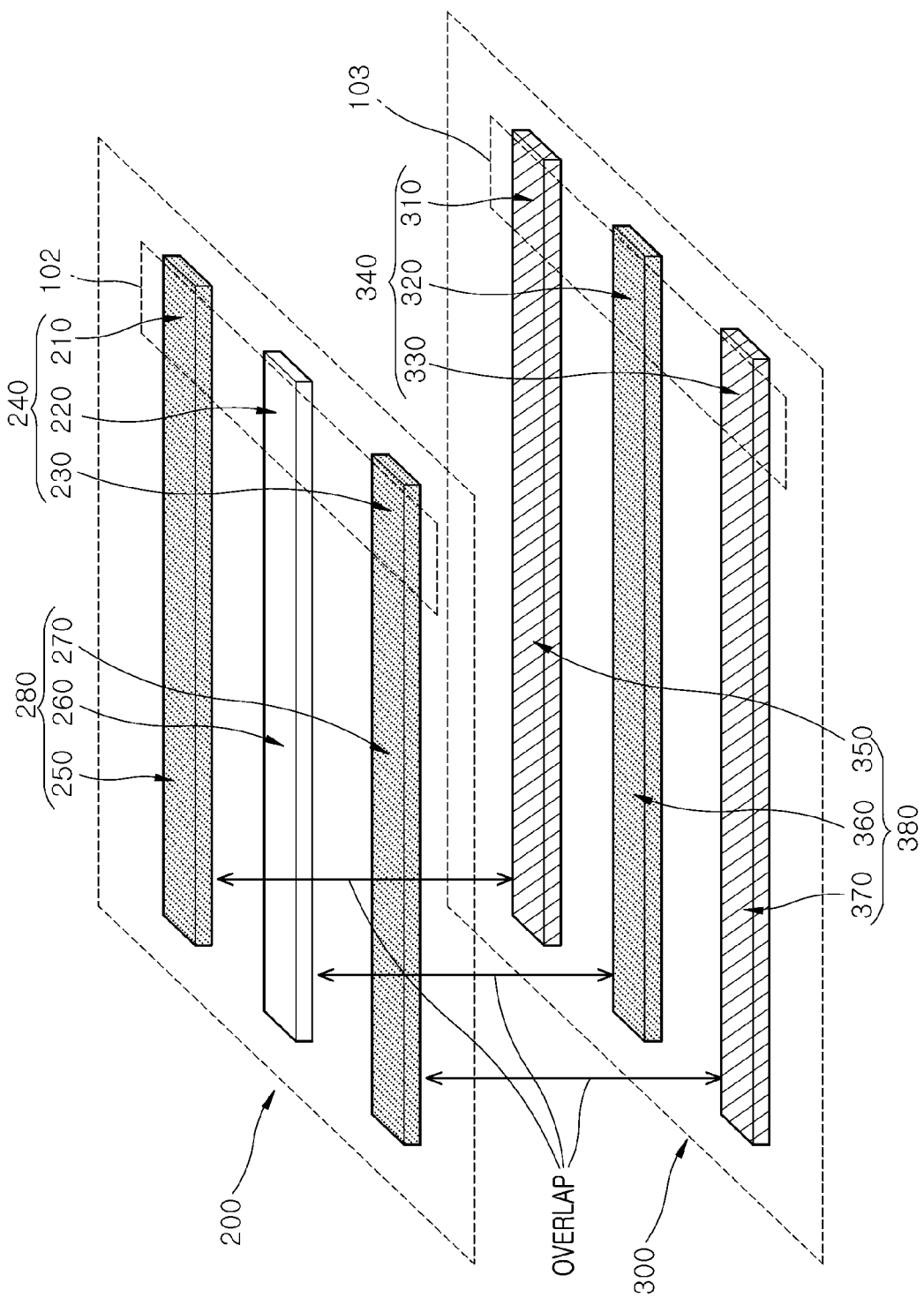
FIG. 7 is a perspective view illustrating traces disposed in a semiconductor package according to an embodiment.
Figure 8:
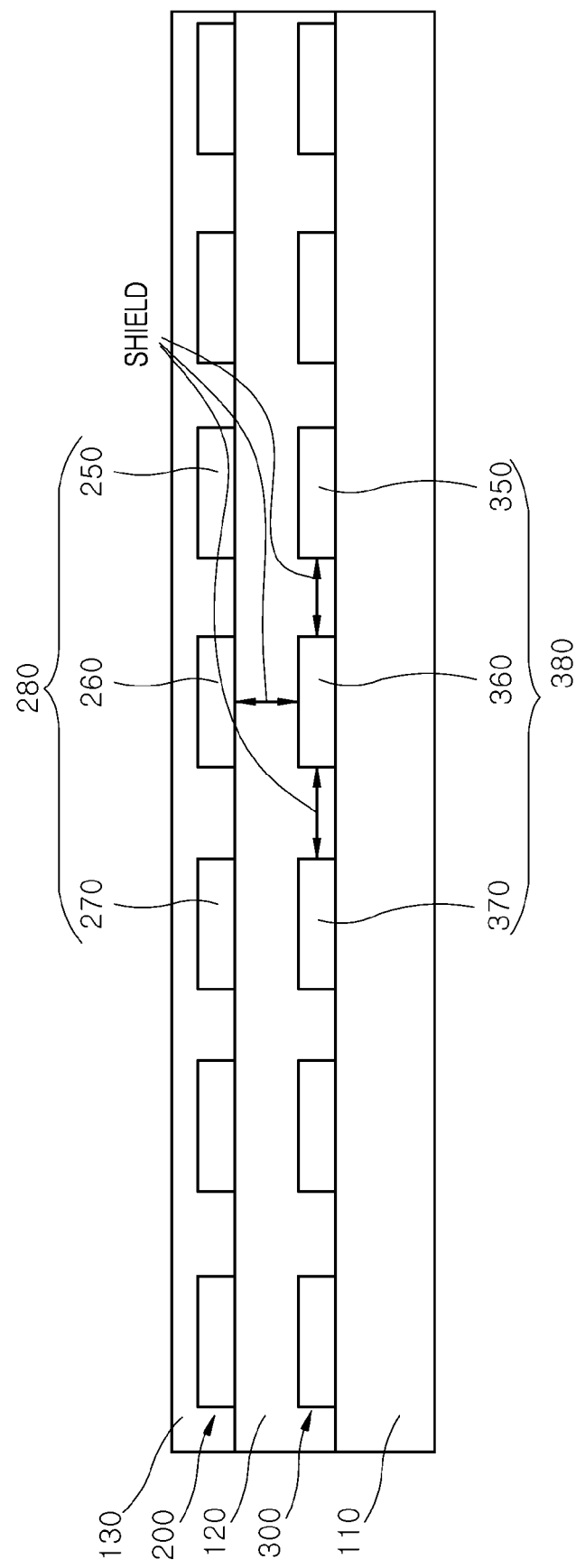
FIG. 8 is a cross-sectional view illustrating traces disposed in a semiconductor package according to an embodiment.

FIG. 7 is a perspective view illustrating the traces 280 and 380 disposed in the semiconductor package 10. In FIG. 7, the vias and additional interconnection lines connected to the traces 280 and 380 will be omitted for the purpose of ease and convenience in explanation. FIG. 8 is a cross-sectional view illustrating the traces 280 and 380 disposed in the semiconductor package 10.

Referring to FIGS. 6 and 7, the first layer of traces 280 may be configured to include a first signal trace 250, a ground trace 260, and a second signal trace 270 which are disposed in the first layer 200. The first signal trace 250 may be a conductive line extending from the first signal bond finger 210. The ground trace 260 may be a conductive line extending from the ground bond finger 220. The second signal trace 270 may be a conductive line extending from the second signal bond finger 230. Because the first signal bond finger 210, the ground bond finger 220, and the second signal bond finger 230 are sequentially arrayed in one column to provide the first column of bond fingers 240, the first signal trace 250, the ground trace 260 and the second signal trace 270 may be sequentially arrayed in the first layer 200 to provide the first layer of traces 280.

The second layer of traces 380 may be configured to include a first power trace 350, a third signal trace 360, and a second power trace 370 which are disposed in the second layer 300. The first power trace 350 may be a conductive line extending from the first power bond finger 310. The third signal trace 360 may be a conductive line extending from the third signal bond finger 320. The second power trace 370 may be a conductive line extending from the second power bond finger 330. Because the first power bond finger 310, the third signal bond finger 320, and the second power bond finger 330 are sequentially arrayed in one column to provide the second column of bond fingers 340, the first power trace 350, the third signal trace 360, and the second power trace 370 may be sequentially arrayed in the second layer 300 to provide the second layer of traces 380.

The ground trace 260 may be located to vertically and partially overlap with the third signal trace 360. Thus, the third signal trace 360 may be electromagnetically shielded in a vertical direction by the ground trace 260. The third signal trace 360 may be disposed between the first and second power traces 350 and 370 in the second layer 300. Thus, the third signal trace 360 may be electromagnetically shielded in a lateral direction by the first and second power traces 350 and 370.

The electromagnetic shield of the third signal trace 360 may be more readily understood by the cross-sectional view of FIG. 8. Referring to FIG. 8, the third signal trace 360 may be three-dimensionally shielded by the ground trace 260 and the first and second power traces 350 and 370. Thus, the ground trace 260 and the first and second power traces 350 and 370 may suppress or reduce the electromagnetic interference affecting the third signal trace 360. That is, the ground trace 260 and the first and second power traces 350 and 370 may suppress or reduce signals transmitted through the first and second signal traces 250 and 270 from electromagnetically affecting a signal transmitted through the third signal trace 360.

Referring again to FIG. 8, additional ground/power traces and additional signal traces may be alternately arrayed in the first layer 200 to be located at one side of the first signal trace 250 opposite to the ground trace 260 or at one side of the second signal trace 270 opposite to the ground trace 260. Similarly, additional signal traces and additional power/ground traces may be alternately arrayed in the second layer 300 to be located at one side of the first power trace 350 opposite to the third signal trace 360 or at one side of the second power trace 370 opposite to the third signal trace 360. As such, the traces 280 and 380 may provide a three-dimensional electromagnetic shield structure for the first signal trace 250 (or the second signal trace 270). The first signal trace 250 (or the second signal trace 270) may be electromagnetically shielded in a lateral direction by the ground trace 260 and the additional power/ground traces in the first layer 200 and may be electromagnetically shielded in a vertical direction by the first power trace 350 (or the second power trace 370) disposed in the second layer 300. Accordingly, it may be possible to suppress or reduce the electromagnetic interference effect of a signal transmitted through the first signal trace 250 being influenced by signals transmitted through the second and third signal traces 270 and 360 due to the presence of the ground trace 260 and the first power trace 350.

As illustrated in FIG. 8, the first and third signal traces 250 and 360 may be disposed in a first diagonal direction, and the second and third signal traces 270 and 360 may be disposed in a second diagonal direction intersecting the first diagonal direction. Thus, the first signal trace 250 (or the second signal trace 270) may be disposed to be farther from the third signal trace 360 than the ground trace 260 or the first and second power traces 350 and 370. Accordingly, a signal transmitted through the third signal trace 360 may be electromagnetically less affected by signals transmitted through the first and second signal traces 250 and 270.

Because the electromagnetic interference phenomenon between the signal traces 250, 270, and 360 is suppressed or reduced by the ground trace 260 and the first and second power traces 350 and 370, it may be possible to improve the performance or the signal integrity of the semiconductor package 10.

A structure of the semiconductor package 10 described above may also be applicable to other semiconductor packages including a plurality of semiconductor chips which are vertically stacked.

Figure 9:
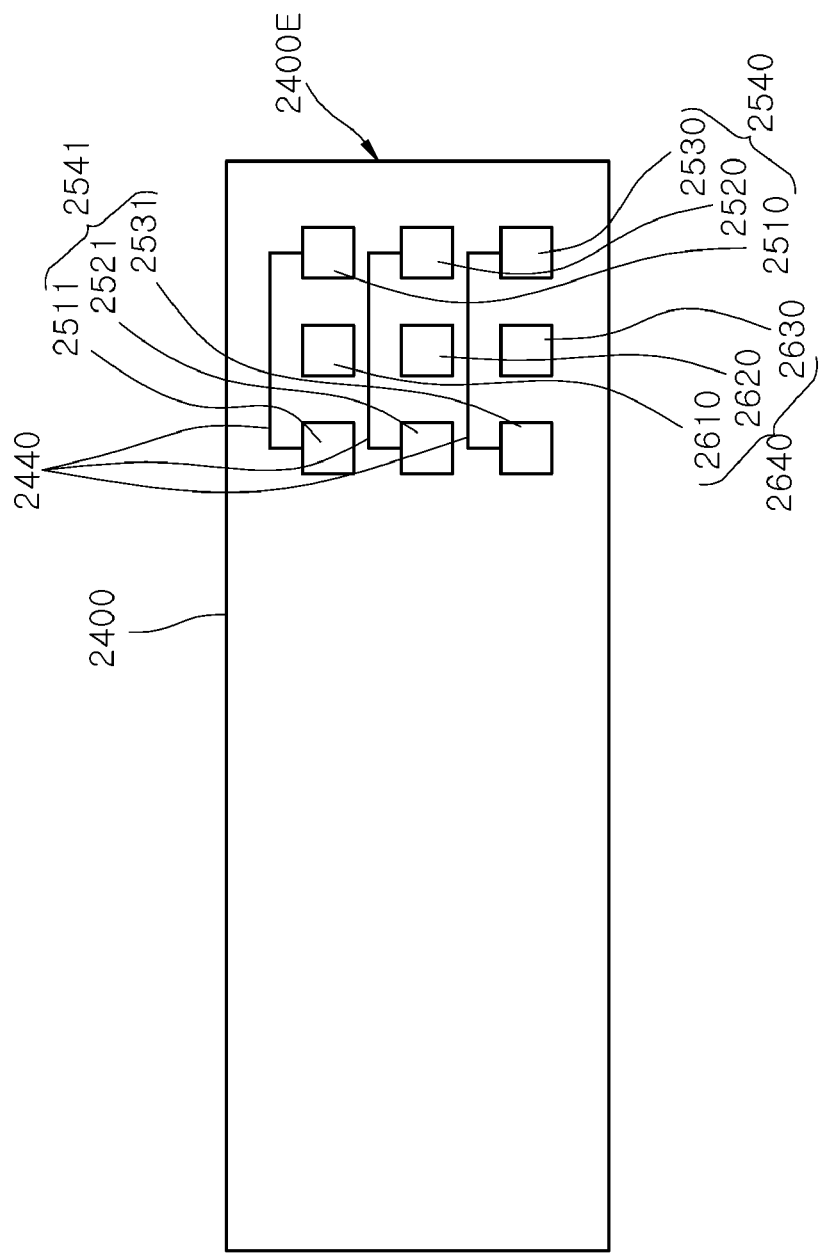
FIGS. 9 and 10 are plan views illustrating chip pads arrayed in semiconductor chips included in a semiconductor package according to an embodiment.

FIG. 9 is a plan view illustrating a chip pad array of a first semiconductor chip 2400 employed in a semiconductor package according to an embodiment.

Referring to FIG. 9, a semiconductor package according to an embodiment may be configured to include the first semiconductor chip 2400. The first semiconductor chip 2400 may include a first column of chip pads 2540 arrayed in a first column, a second column of chip pads 2640 arrayed in a second column, and a third column of chip pads 2541 arrayed in a third column. The first, second, and third columns in which the first, second, and third columns of chip pads 2540, 2640, and 2541 are arrayed may be parallel with an edge 2400E of the first semiconductor chip 2400. In such a case, the first column of chip pads 2540 may be located between the third column of chip pads 2541 and the edge 2400E of the first semiconductor chip 2400, and the second column of chip pads 2640 may be located between the first column of chip pads 2540 and the third column of chip pads 2541.

The first column of chip pads 2540 may include a first signal pad 2510, a ground pad 2520, and a second signal pad 2530 which are sequentially arrayed in the first column. The second column of chip pads 2640 may include a first power pad 2610, a third signal pad 2620, and a second power pad 2630 which are sequentially arrayed in the second column.

The third signal pad 2620 and the ground pad 2520 may be arrayed in the same row to be disposed side by side. The third signal pad 2620 may be disposed to be relatively closer to the ground pad 2520 than the first and second signal pads 2510 and 2530. The first power pad 2610 and the first signal pad 2510 may be arrayed in the same row to be disposed side by side. The second power pad 2630 and the second signal pad 2530 may be arrayed in the same row to be disposed side by side. The first signal pad 2510, the third signal pad 2620, and the second signal pad 2530 may be arrayed in a zigzag fashion along a direction which is parallel with the first and second columns.

The first semiconductor chip 2400 may further include common interconnection lines 2440. The common interconnection lines 2440 may electrically connect the third column of chip pads 2541 to the first column of chip pads 2540.

The third column of chip pads 2541 may include a first extension signal pad 2511, an extension ground pad 2521, and a second extension signal pad 2531 which are sequentially arrayed in the third column. The first extension signal pad 2511, the extension ground pad 2521, and the second extension signal pad 2531 may be electrically connected to the first signal pad 2510, the ground pad 2520, and the second signal pad 2530 through the common interconnection lines 2440, respectively.

The common interconnection lines 2440 may provide an effect that substantially shifts or extends the first signal pad 2510, the ground pad 2520, and the second signal pad 2530 to respective ones of the first extension signal pad 2511, the extension ground pad 2521, and the second extension signal pad 2531. The common interconnection lines 2440 may act as redistribution lines that move or extend positions of the pads 2510, 2520, and 2530. The common interconnection lines 2440 may include conductive lines that extend from the third column of chip pads 2541, detour the second column of chip pads 2640, and reach the first column of chip pads 2540. In an embodiment, detour means that the common interconnection lines 2440 do not electrically connect with the second column of chip pads 2640, as shown in FIG. 9.

Figure 10:
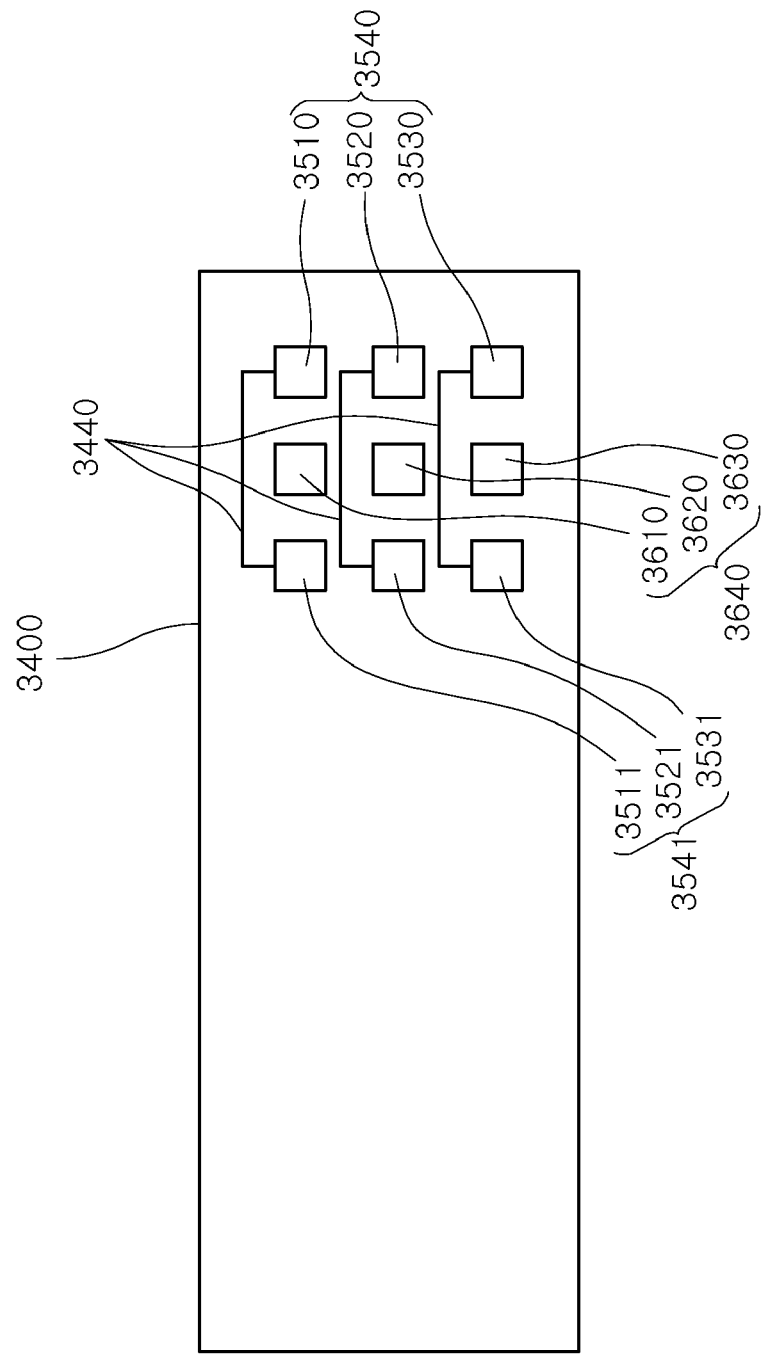

FIG. 10 is a plan view illustrating a chip pad array of a second semiconductor chip 3400 employed in a semiconductor package according to an embodiment.

Referring to FIG. 10, a semiconductor package according to an embodiment may be configured to further include the second semiconductor chip 3400. The second semiconductor chip 3400 may include a first column of chip pads 3540 arrayed in a first column, a second column of chip pads 3640 arrayed in a second column, and a third column of chip pads 3541 arrayed in a third column.

The first column of chip pads 3540 may be arrayed to have the same configuration as the first column of chip pads 2540 of the first semiconductor chip 2400 shown in FIG. 9. The second column of chip pads 3640 may be arrayed to have the same configuration as the second column of chip pads 2640 of the first semiconductor chip 2400 shown in FIG. 9. The third column of chip pads 3541 may be arrayed to have the same configuration as the third column of chip pads 2541 of the first semiconductor chip 2400 shown in FIG. 9.

The first column of chip pads 3540 may include a first signal pad 3510, a ground pad 3520, and a second signal pad 3530 which are sequentially arrayed in the first column. The first signal pad 3510, the ground pad 3520, and the second signal pad 3530 may be disposed to have substantially the same array as the first signal pad 2510, the ground pad 2520, and the second signal pad 2530 of the first semiconductor chip 2400. The second column of chip pads 3640 may include a first power pad 3610, a third signal pad 3620, and a second power pad 3630 which are sequentially arrayed in the second column. The first power pad 3610, the third signal pad 3620, and the second power pad 3630 may be disposed to have substantially the same array as the first power pad 2610, the third signal pad 2620, and the second power pad 2630 of the first semiconductor chip 2400. The third signal pad 3620 and the ground pad 3520 may be arrayed in the same row to be disposed side by side.

The second semiconductor chip 3400 may further include common interconnection lines 3440. The common interconnection lines 3440 may be disposed to be adjacent to the second column of chip pads 3640, respectively. The common interconnection lines 3440 may electrically connect the third column of chip pads 3541 to the first column of chip pads 3540.

The third column of chip pads 3541 may include a first extension signal pad 3511, an extension ground pad 3521, and a second extension signal pad 3531 which are sequentially arrayed in the third column. The first extension signal pad 3511, the extension ground pad 3521, and the second extension signal pad 3531 may be electrically connected to the first signal pad 3510, the ground pad 3520, and the second signal pad 3530 through the common interconnection lines 3440, respectively.

Figure 11:
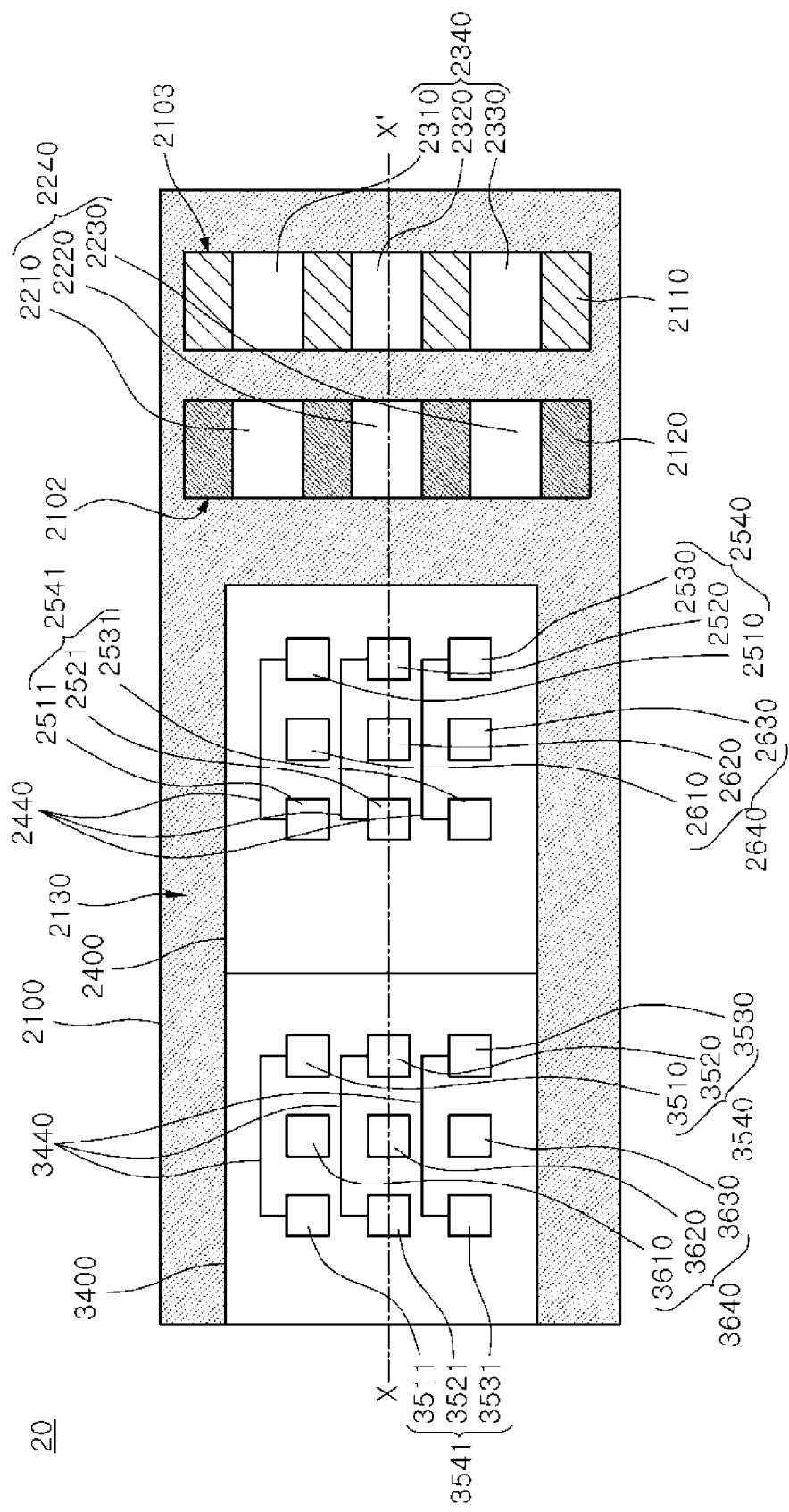
FIGS. 11 to 13 are plan views and a cross-sectional view illustrating a semiconductor package according to an embodiment.
Figure 12:
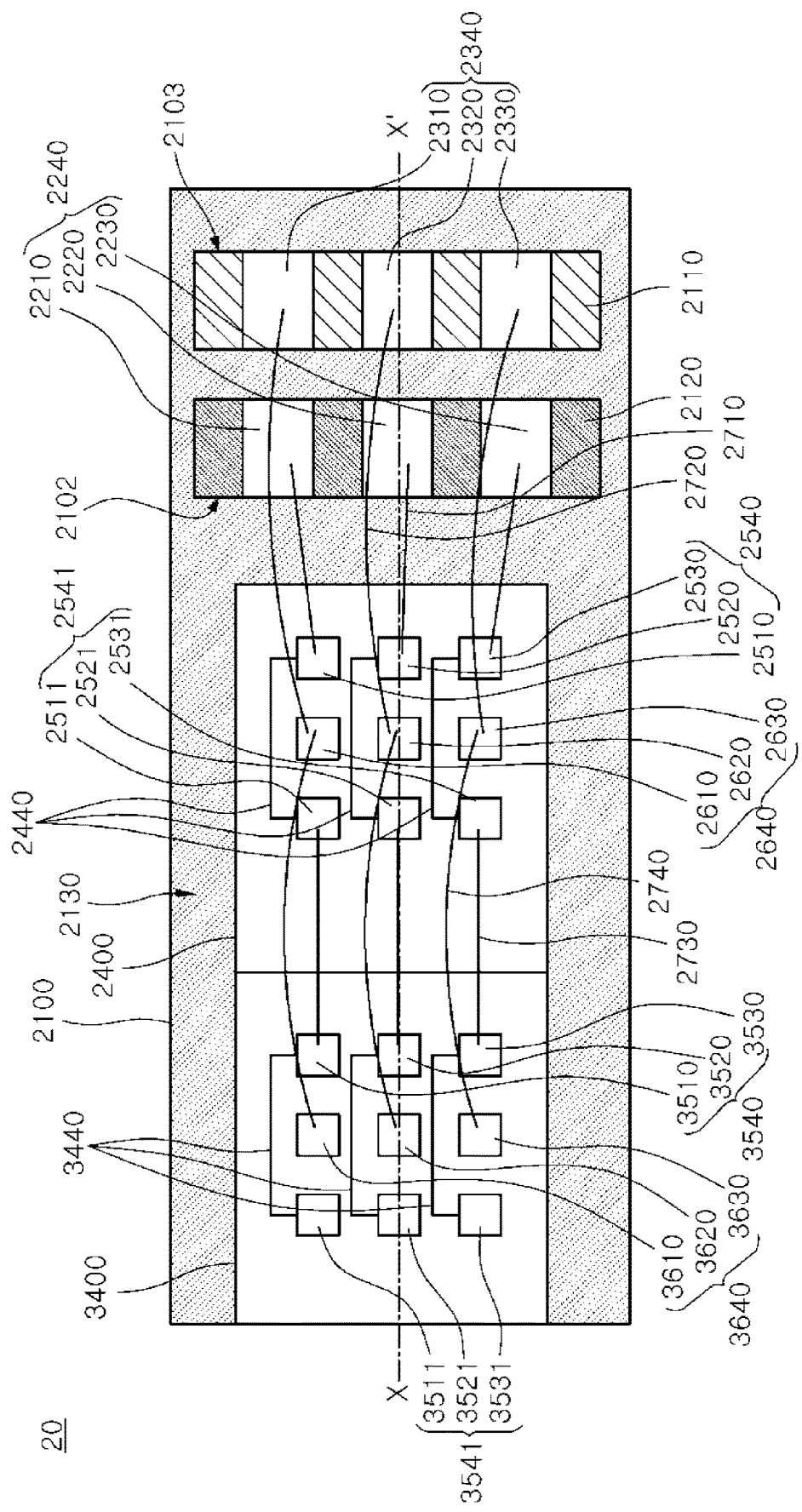
Figure 13:
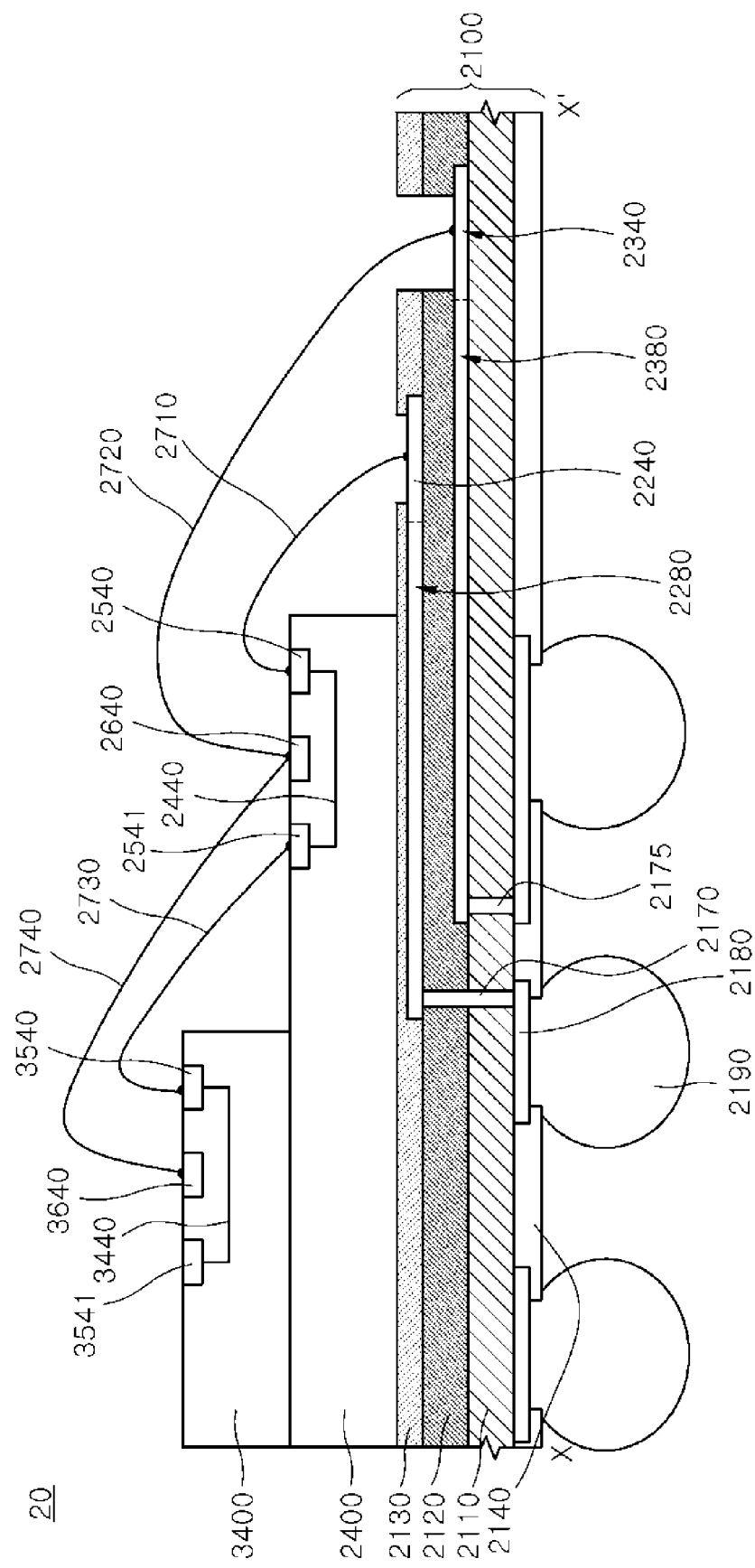

FIGS. 11 to 13 are plan views and a cross-sectional view illustrating a semiconductor package 20 according to an embodiment. FIG. 11 is a plan view illustrating the first and second semiconductor chips 2400 and 3400 stacked on a package substrate 2100 of the semiconductor package 20. FIG. 12 is a plan view illustrating first to fourth bonding wires 2710, 2720, 2730, and 2740 connecting the package substrate 2100 to the semiconductor chips 2400 and 3400. FIG. 13 is a cross-sectional view taken along a line X-X' of FIG. 12.

Referring to FIGS. 11 and 13, the semiconductor package 20 may include the package substrate 2100, the first semiconductor chip 2400 disposed on the package substrate 2100, and the second semiconductor chip 3400 stacked on the first semiconductor chip 2400. The package substrate 2100 may be configured to include a first column of bond fingers 2240 disposed in a first layer and a second column of bond fingers 2340 disposed in a second layer. The first semiconductor chip 2400 may be disposed to be spaced apart from the first column of bond fingers 2240 and the second column of bond fingers 2340 such that the first column of bond fingers 2240 and the second column of bond fingers 2340 are revealed. The second semiconductor chip 3400 may be stacked on the first semiconductor chip 2400 to provide a step structure. The second semiconductor chip 3400 may be stacked on the first semiconductor chip 2400 to reveal the chip pad array 2540, 2640, and 2541 of the first semiconductor chip 2400.

The first column of bond fingers 2240 may include a first signal bond finger 2210, a ground bond finger 2220, and a second signal bond finger 2230 which are sequentially arrayed in a first column. The second column of bond fingers 2340 may include a first power bond finger 2310, a third signal bond finger 2320, and a second power bond finger 2330 which are sequentially arrayed in a second column. In such a case, the third signal bond finger 2320 and the ground bond finger 2220 may be arrayed in the same row to be disposed side by side.

As illustrated in FIG. 11, a third dielectric layer 2130 may have a first opening portion 2102 revealing the first column of bond fingers 2240 and a second opening portion 2103 revealing the second column of bond fingers 2340.

As illustrated in FIG. 13, the package substrate 2100 may be configured to include a first dielectric layer 2110, a second dielectric layer 2120, the third dielectric layer 2130, and a fourth dielectric layer 2140. The package substrate 2100 may further include a third layer of traces 2180, a first conductive via 2170, and a second conductive via 2175. Outer connectors 2190 such as solder balls may be attached to portions of the third layer of traces 2180.

A first layer of traces 2280 may extend from respective ones of the first column of bond fingers 2240, and a second layer of traces 2380 may extend from respective ones of the second column of bond fingers 2340. As described with reference to FIG. 7, the first layer of traces 2280 may partially overlap with the second layer of traces 2380. For example, the first layer of traces 2280 may be configured to include the first signal trace 250, the ground trace 260, and the second signal trace 270 which are illustrated in FIG. 7. Moreover, the second layer of traces 2380 may be configured to include the first power trace 350, the third signal trace 360, and the second power trace 370 which are illustrated in FIG. 7.

Referring to FIGS. 12 and 13, the semiconductor package 20 may be configured to include the first to fourth bonding wires 2710, 2720, 2730, and 2740 connecting the chip pads of the semiconductor chips 2400 and 3400 to the bond fingers of the package substrate 2100. The first bonding wires 2710 may connect the first column of chip pads 2540 to respective one of the first column of bond fingers 2240. The second bonding wires 2720 may connect the second column of chip pads 2640 to respective one of the second column of bond fingers 2340. A distance between the first column of chip pads 2540 and the first column of bond fingers 2240 may be less than a distance between the second column of chip pads 2640 and the second column of bond fingers 2340. Thus, the first bonding wires 2710 may be shorter than the second bonding wires 2720. That is, the second bonding wires 2720 may be longer than the first bonding wires 2710.

The third bonding wires 2730 may connect the first column of chip pads 3540 of the second semiconductor chip 3400 to the third column of chip pads 2541 of the first semiconductor chip 2400. The fourth bonding wires 2740 may connect the second column of chip pads 3640 of the second semiconductor chip 3400 to the second column of chip pads 2640 of the first semiconductor chip 2400.

In a structure that the second semiconductor chip 3400 is stacked on the first semiconductor chip 2400, the second semiconductor chip 3400 may be connected to the package substrate 2100 through the first semiconductor chip 2400. In such a case, if the third bonding wires 2730 are formed to directly connect the first column of chip pads 3540 of the second semiconductor chip 3400 to the first column of chip pads 2540 of the first semiconductor chip 2400, the third bonding wires 2730 may cross with the second and fourth wires 2720 and 2740. Thus, the third bonding wires 2730 may be in contact with the second and fourth wires 2720 and 2740 to cause malfunction of the semiconductor package 20.

In order to prevent the third bonding wires 2730 from crossing with the second and fourth wires 2720 and 2740, the third bonding wires 2730 may be formed to connect the first column of chip pads 3540 of the second semiconductor chip 3400 to the third column of chip pads 2541 of the first semiconductor chip 2400. Because the second semiconductor chip 3400 is disposed to be closer to the third column of chip pads 2541 of the first semiconductor chip 2400 than the second column of chip pads 2640 of the first semiconductor chip 2400, the third bonding wires 2730 do not cross with the second and fourth wires 2720 and 2740 in the event that the third bonding wires 2730 are formed to directly connect the first column of chip pads 3540 of the second semiconductor chip 3400 to the third column of chip pads 2541 of the first semiconductor chip 2400. Accordingly, it may be possible to prevent the third bonding wires 2730 from being in contact with the second and fourth wires 2720 and 2740.

Because the common interconnection lines 2440 connect the third column of chip pads 2541 of the first semiconductor chip 2400 to the first column of chip pads 2540 of the first semiconductor chip 2400, the third bonding wires 2730 may electrically connect the first column of chip pads 3540 of the second semiconductor chip 3400 to the first column of chip pads 2540 of the first semiconductor chip 2400 without any connection failure between the bonding wires 2710, 2720, 2730, and 2740.

Meanwhile, a third semiconductor chip (not shown) may be additionally stacked on the second semiconductor chip 3400. In such a case, additional bonding wires (not shown) may be provided to connect the third semiconductor chip to the third column of chip pads 3541 of the second semiconductor chip 3400. As a result, the additional bonding wires may be electrically connected to the first column of chip pads 3540 of the second semiconductor chip 3400 through the common interconnection lines 3440 of the second semiconductor chip 3400.

Figure 14:
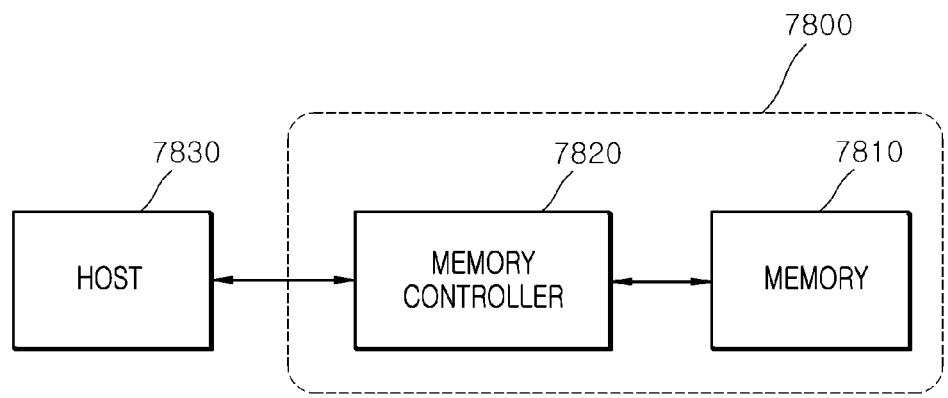
FIG. 14 is a block diagram illustrating an electronic system employing a memory card including at least one semiconductor package according to an embodiment.

FIG. 14 is a block diagram illustrating an electronic system including a memory card 7800 employing at least one semiconductor package according to an embodiment. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one semiconductor package according to an embodiment.

The memory 7810 may include a nonvolatile memory device in accordance with an embodiment of the present disclosure. The memory controller 7820 may control the memory 7810 such that stored data is read out or data is stored in response to a read/write request from a host 7830.

Figure 15:
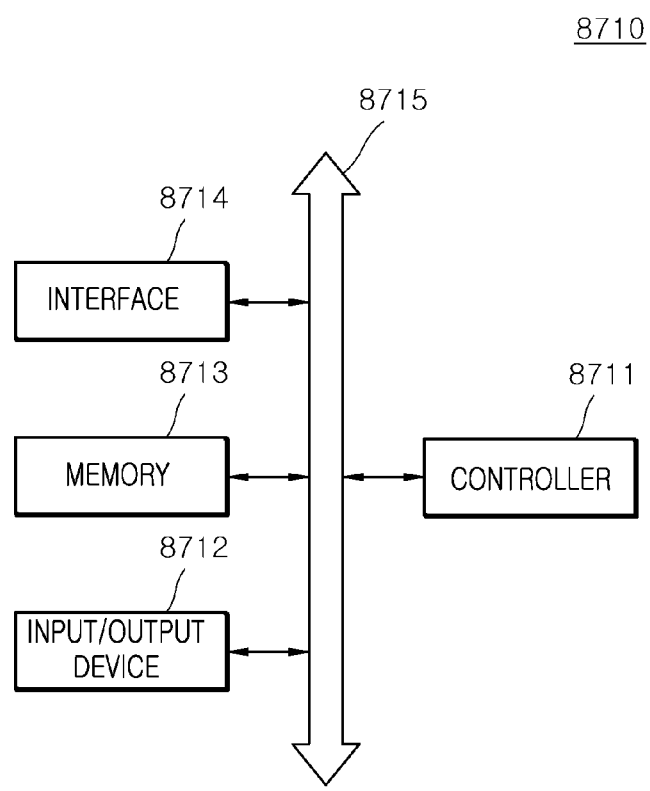
FIG. 15 is a block diagram illustrating another electronic system including at least one semiconductor package according to an embodiment.

FIG. 15 is a block diagram illustrating an electronic system 8710 including at least one semiconductor package according to an embodiment. The electronic system 8710 may include a controller 8711, an input/output unit 8712, and a memory 8713. The controller 8711, the input/output unit 8712, and the memory 8713 may be coupled with one another through a bus 8715 providing a path through which data can move.

In an embodiment, the controller 8711 may include one or more of a microprocessor, digital signal processor, microcontroller, and/or logic device capable of performing the same functions as these components. The controller 8711 or the memory 8713 may include at least one of the semiconductor packages according to the embodiments of the present disclosure. The input/output unit 8712 may include at least one selected among a keypad, a keyboard, a display device, a touchscreen, and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDAM (wideband code division multiple access), CDMA2000, LTE (long term evolution), or Wibro (wireless broadband Internet).

Embodiments of the present disclosure have been disclosed for illustrative purposes. Those skilled in the art will appreciate that various modifications, additions, and/or substitutions are possible, without departing from the scope and spirit of the present disclosure and the accompanying claims.

What is claimed is:

1. A semiconductor package comprising:
a package substrate including a first column of bond fingers arrayed in a first layer and a second column of bond fingers arrayed in a second layer;
a first semiconductor chip disposed on the package substrate to include a first column of chip pads arrayed in a first column, a second column of chip pads arrayed in a second column, a third column of chip pads arrayed in a third column located at one side of the second column opposite to the first column, and common interconnection lines for connecting the third column of chip pads to the first column of chip pads;
a second semiconductor chip disposed on the first semiconductor chip to include a first column of chip pads and a second column of chip pads;
first bonding wires connecting the first column of bond fingers to the first column of chip pads of the first semiconductor chip;
second bonding wires connecting the second column of bond fingers to the second column of chip pads of the first semiconductor chip;
third bonding wires connecting the first column of chip pads of the second semiconductor chip to the third column of chip pads of the first semiconductor chip; and
fourth bonding wires connecting the second column of chip pads of the second semiconductor chip to the second column of chip pads of the first semiconductor chip.

2. The semiconductor package of claim 1,
wherein the first column of chip pads of the first semiconductor chip includes a first signal pad, a ground pad, and a second signal pad which are sequentially arrayed;
wherein the second column of chip pads of the first semiconductor chip includes a first power pad, a third signal pad, and a second power pad which are sequentially arrayed; and
wherein the third signal pad of the first semiconductor chip and the ground pad of the first semiconductor chip are arrayed side-by-side in a row.

3. The semiconductor package of claim 2, wherein the third signal pad of the first semiconductor chip is closer to the ground pad of the first semiconductor chip than the first and second signal pads of the first semiconductor chip.

4. The semiconductor package of claim 2,
wherein the first column of chip pads of the second semiconductor chip includes a first signal pad, a ground pad, and a second signal pad which are sequentially arrayed in the same order as the first signal pad, the ground pad, and the second signal pad of the first semiconductor chip are arrayed;
wherein the second column of chip pads of the second semiconductor chip includes a first power pad, a third signal pad, and a second power pad which are sequentially arrayed in the same order as the first power pad, the third signal pad, and the second power pad of the first semiconductor chip are arrayed; and
wherein the third signal pad and the ground pad of the second semiconductor chip are arrayed side-by-side in a row.

5. The semiconductor package of claim 2, wherein the first signal pad, the third signal pad, and the second signal pad of the first semiconductor chip are arrayed in a zigzag fashion.

6. The semiconductor package of claim 1,
wherein the third column of chip pads of the first semiconductor chip includes a first extension signal pad, an extension ground pad, and a second extension signal pad which are sequentially arrayed; and
wherein the first extension signal pad, the extension ground pad, and the second extension signal pad of the first semiconductor chip are electrically connected to the first signal pad, the ground pad, and the second signal pad of the first semiconductor chip through the common interconnection lines of the first semiconductor chip, respectively.

7. The semiconductor package of claim 1, wherein the common interconnection lines of the first semiconductor chip are conductive lines that extend from the third column of chip pads of the first semiconductor chip, detour the second column of chip pads of the first semiconductor chip, and reach the first column of chip pads of the first semiconductor chip.

8. The semiconductor package of claim 1, wherein the second semiconductor chip further includes:
a third column of chip pads located at one side of the second column of chip pads of the second semiconductor chip opposite to the first column of chip pads of the second semiconductor chip; and
common interconnection lines connecting the third column of chip pads of the second semiconductor chip to respective ones of the first column of chip pads of the second semiconductor chip.

9. The semiconductor package of claim 1,
wherein the first column of bond fingers includes a first signal bond finger, a ground bond finger, and a second signal bond finger which are sequentially arrayed;
wherein the second column of bond fingers includes a first power bond finger, a third signal bond finger, and a second power bond finger which are sequentially arrayed; and
wherein the third signal bond finger and the ground bond finger are arrayed side-by-side in a row.

10. The semiconductor package of claim 9, further comprising:
a third signal trace extending from the third signal bond finger;
a first power trace extending from the first power bond finger;
a second power trace extending from the second power bond finger; and
a ground trace extending from the ground bond finger and partially overlapping with the third signal trace in a vertical direction,
wherein the third signal trace is located between the first and second power traces in the second layer to be electromagnetically shielded by the first and second power traces, and
wherein the third signal trace is electromagnetically shielded by the ground trace in the vertical direction.

* * * * *